United States Patent [19]
Gittinger et al.

[11] Patent Number: 5,966,736
[45] Date of Patent: Oct. 12, 1999

[54] MULTIPLEXING DRAM CONTROL SIGNALS AND CHIP SELECT ON A PROCESSOR

[75] Inventors: Robert Paul Gittinger; John P. Hansen; Ronald W. Stence, all of Austin, Tex.

[73] Assignee: Advanced Micro Devices, Inc., Sunnyvale, Calif.

[21] Appl. No.: 08/813,726

[22] Filed: Mar. 7, 1997

[51] Int. Cl.$^6$ .................................................. G06F 12/00
[52] U.S. Cl. .......................... 711/207; 711/105; 711/149; 365/189.03
[58] Field of Search ...................... 365/189.03; 711/105, 711/207, 149

[56] References Cited

U.S. PATENT DOCUMENTS

| | | | |
|---|---|---|---|
| 5,748,977 | 5/1998 | Kawasaki et al. ................. | 395/800.33 |
| 5,822,768 | 10/1998 | Shakkarwar ............................ | 711/149 |

OTHER PUBLICATIONS

Advanced Micro Devices, "Am 186™EM and Am 188™EM User's Manual with am 186 Instruction Definitions", 1995, pp.1–1 thru 1–6; 2–1 thru 2–9; 3–1 thru 3–18; 4–1 thru 4–9; 5–1 thru 5–12; 6–1 thru 6–2; 7–1 thru 7–35; and 12–1 thru 12–6.

Advanced Micro Devices, "Am 186™EM and Am188™EM High–Performance, 80C186–and 80C188–Compatible, 16–Bit Embedded Microcontrollers", 196, pp 29–48, 52–68, and 93–96.

Advanced MicroDevices, "Am 186™ES and Am 188™ES High–Performance, 80C186–and 80C188–Compatible, 16–Bit Embedded Microcontrollers", 1996, pp. 24–52, and 65–75.

Primary Examiner—John W. Cabeca
Assistant Examiner—Mehdi Namazi
Attorney, Agent, or Firm—Zagorin, O'Brien & Graham, LLP

[57] ABSTRACT

A DRAM controller is incorporated onto an existing microcontroller architecture. Existing chip select signals or other signals on the microcontroller are multiplexed with RAS and CAS signals. The RAS and CAS signals are asserted when an address is within a specific programmable address range and DRAM mode is enabled. The pins selected for RAS and CAS provide regular signals such as chip selects when not in DRAM mode. The timing of the chip select signal signals are adjusted when the chip select signals are utilized as column and row address strobes. Additionally, multiplexed addresses are provided from the microcontroller as well as refresh control. The microcontroller can provide high byte and low byte access by providing an upper column address strobe signal (UCAS) to support access for high byte and word access and a lower column address strobe signal (LCAS) to support low byte and word access. Mid range chip selects provide the UCAS and LCAS signals. A lower chip select signal (LCS) may provide a first RAS signal which is active in a first DRAM mode. The LCS signal is asserted as a first RAS signal when an address within a programmable memory range and the first DRAM mode is enabled. A second RAS signal provides access to a DRAM mapped into the upper half of memory. A mid range chip select pin is multiplexed with the second RAS signal.

14 Claims, 17 Drawing Sheets

Upper Memory Chip Select Register (UMCS)

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Value | 0 | LB2 | LB1 | LB0 | 0 | 0 | 0 | 0 | DA | UDEN | 1 | 1 | 1 | R2 | R1 | R0 |

Lower Memory Chip Select Register (LMCS)

| Bit | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Value | 0 | UB2 | UB1 | UB0 | 0 | 0 | 0 | 0 | DA | LDEN | 1 | 1 | 1 | R2 | R1 | R0 |

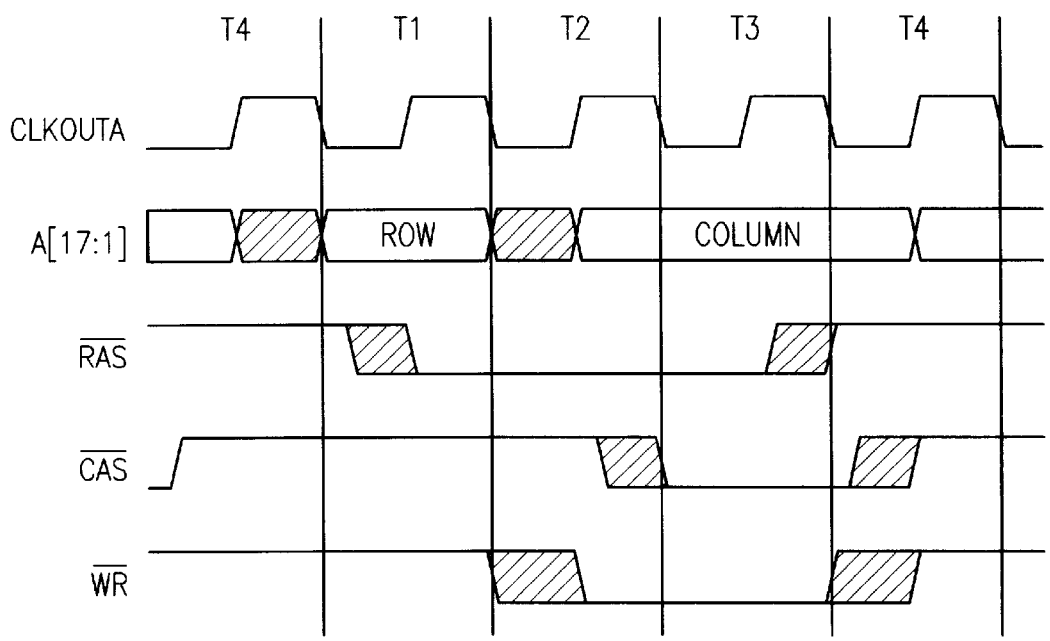
FIG. 4   DRAM Write Cycle Timing
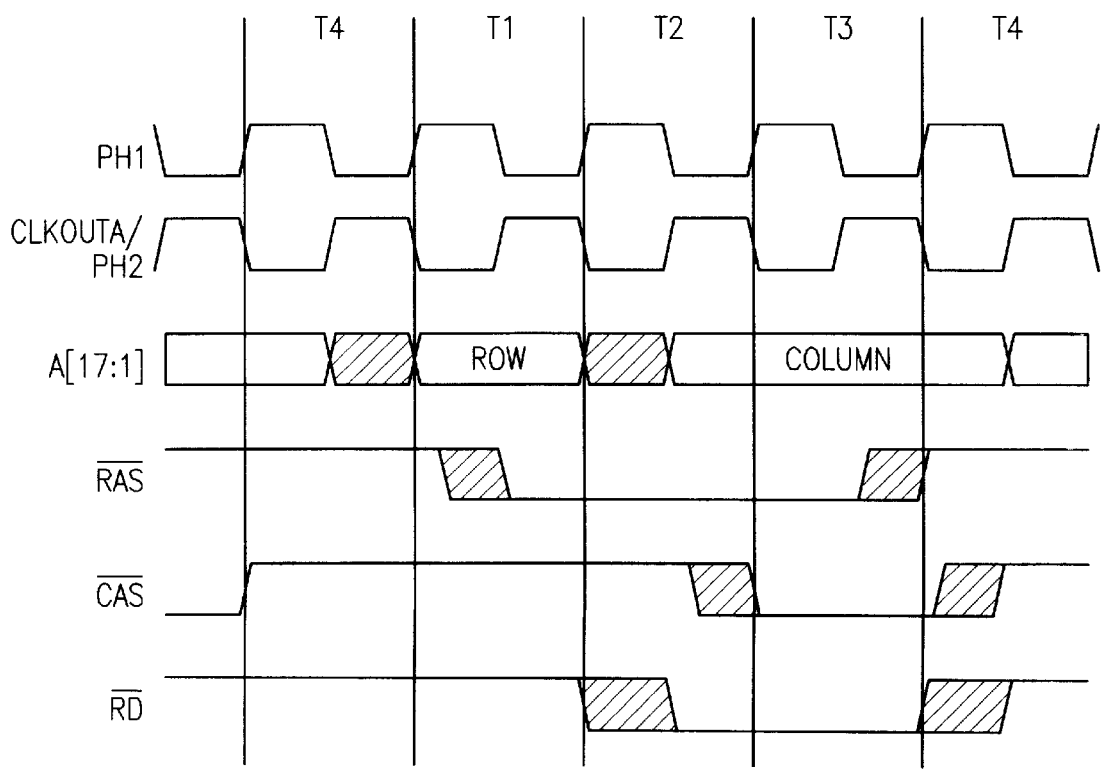
FIG. 5   DRAM Read Cycle Timing

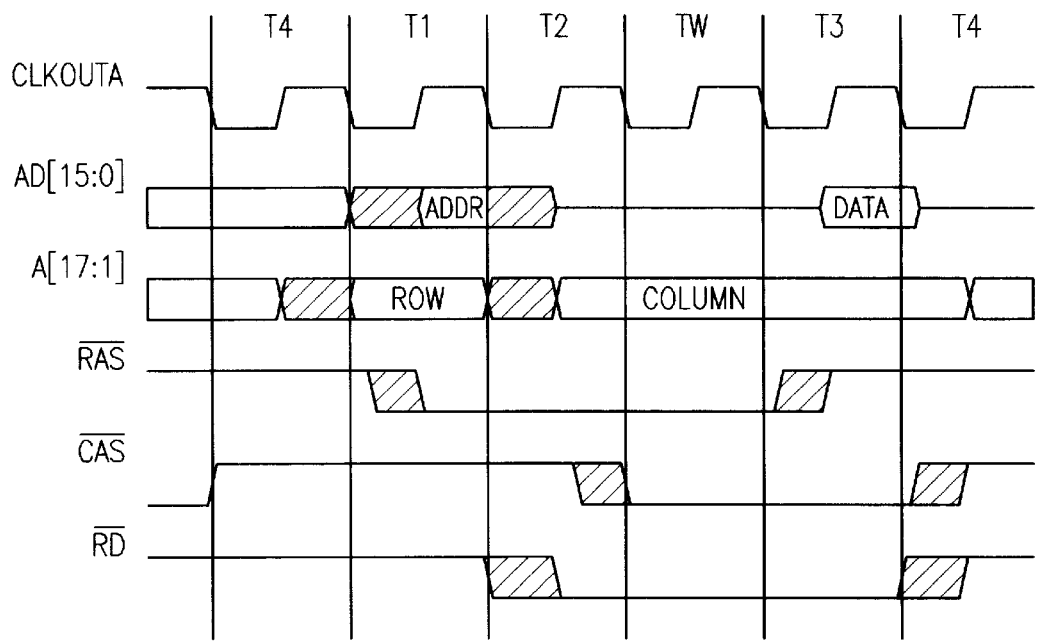
FIG. 6 DRAM Read Cycle Timing with Wait State(s)
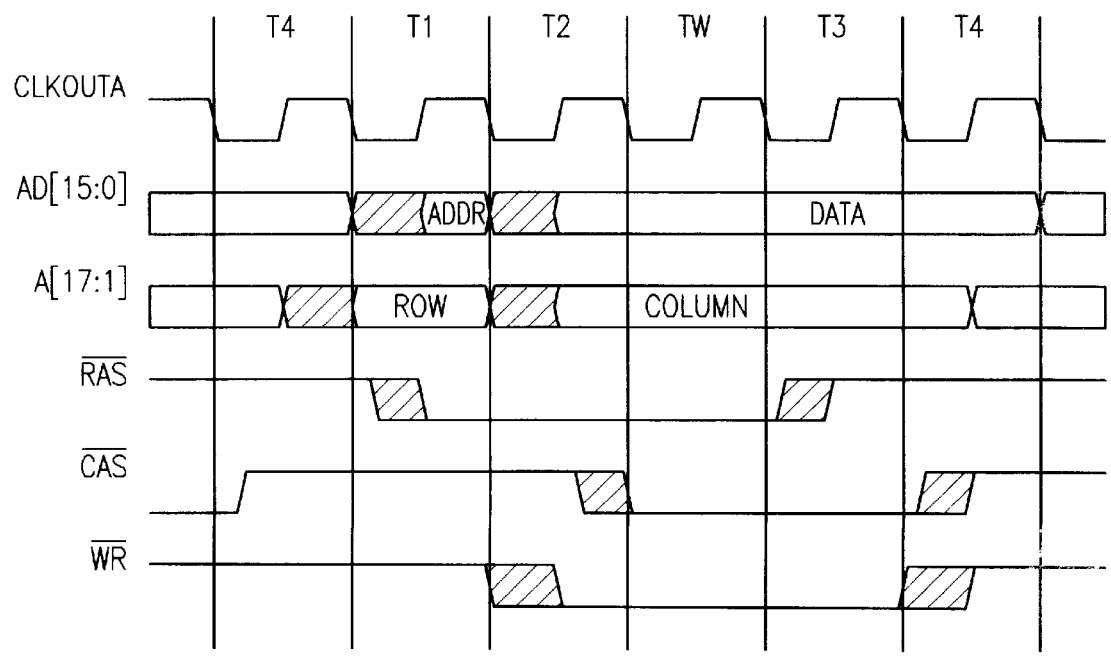
FIG. 7 DRAM Write Cycle Timing with Wait State(s)

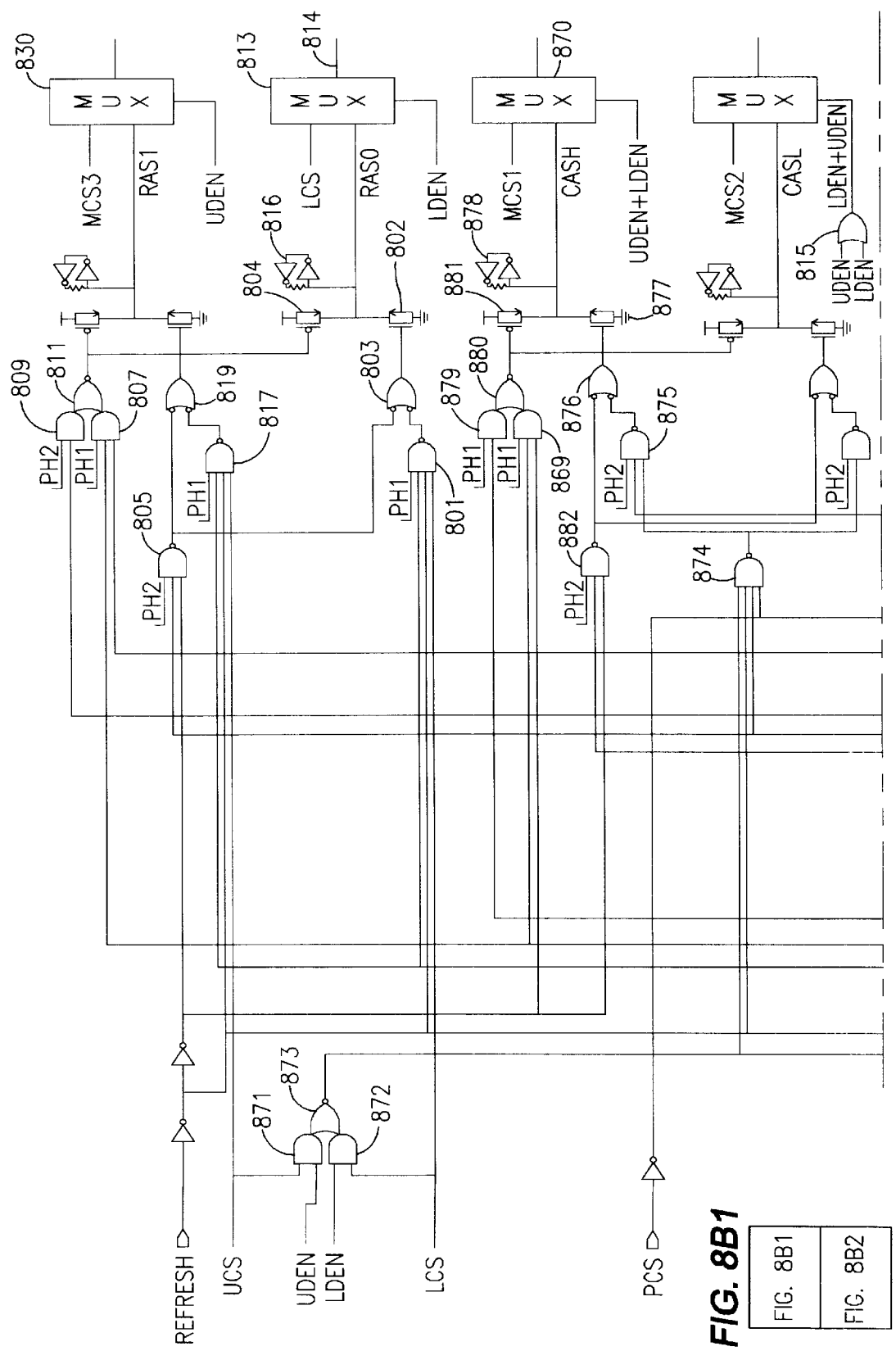

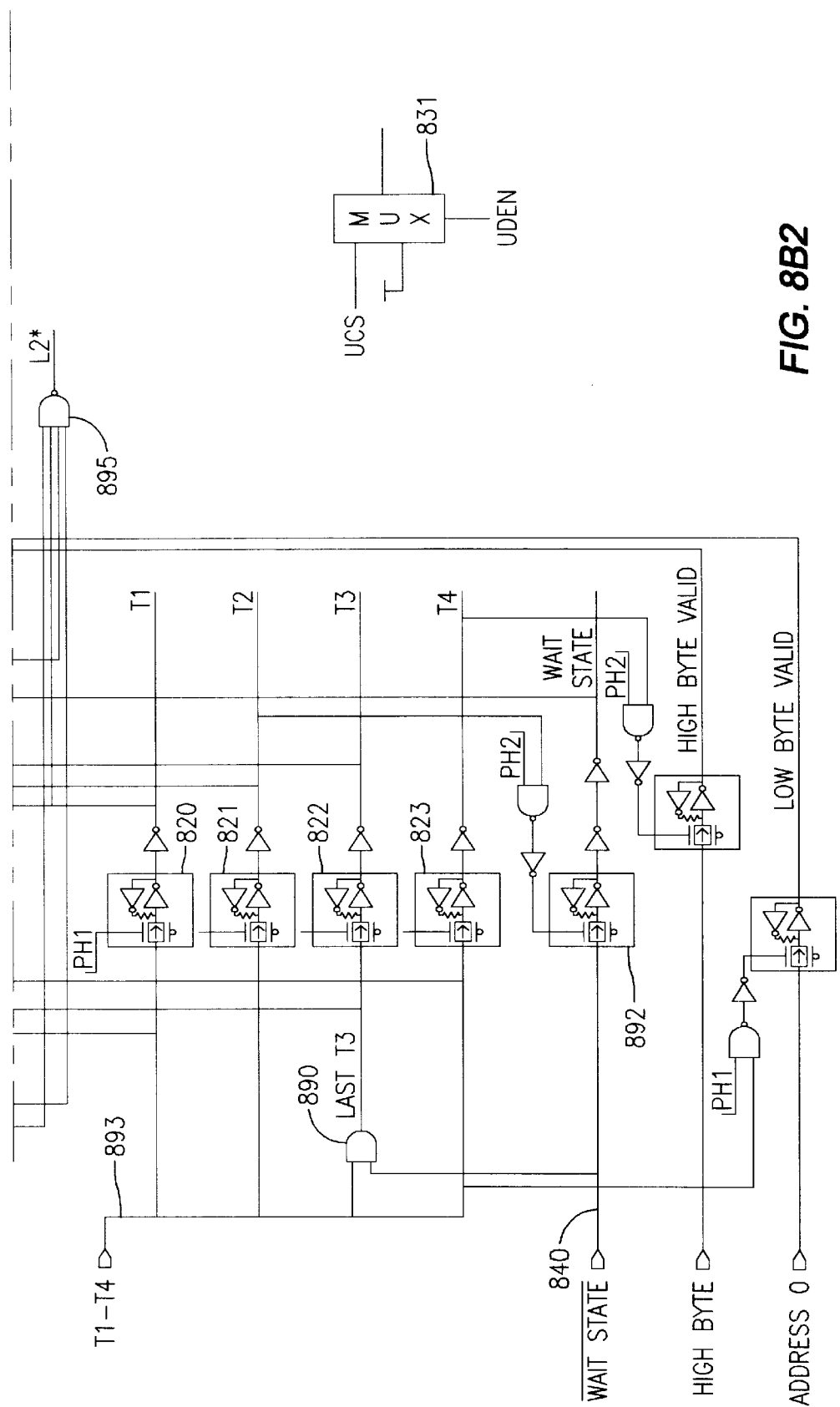
FIG. 8B2

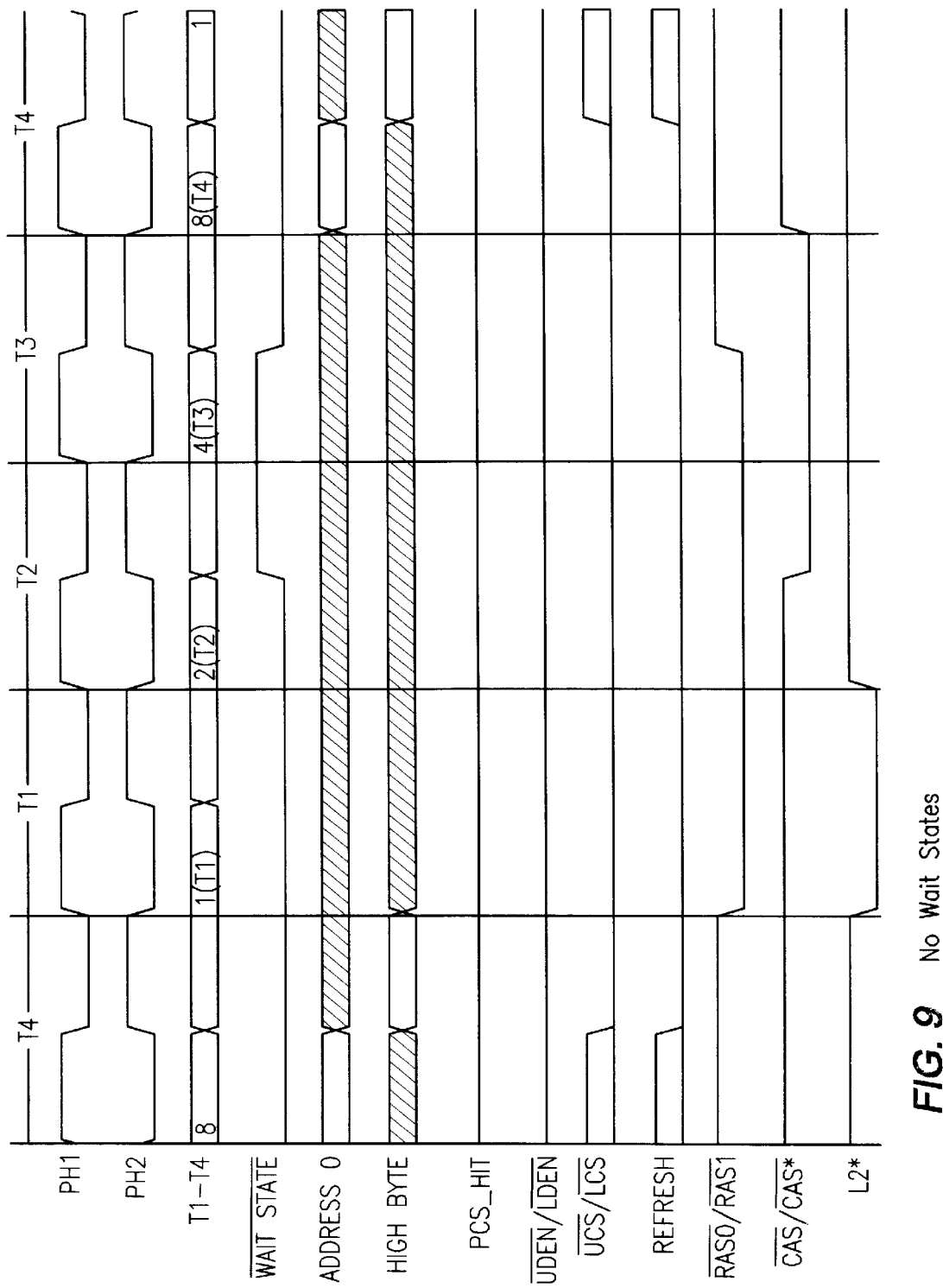
FIG. 9   No Wait States

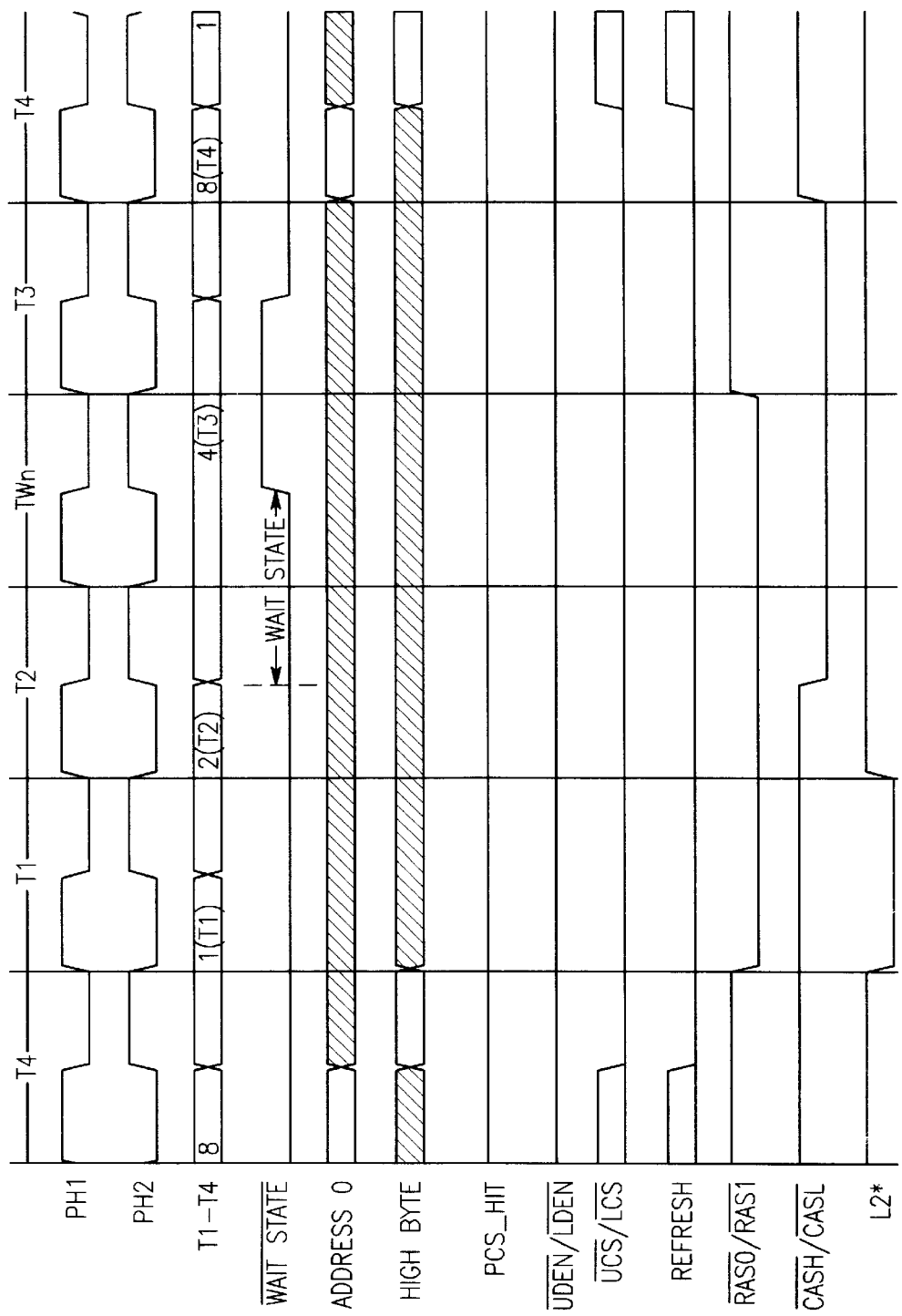
FIG. 10 DRAM Cycle with Wait States

| Bit | 15-11 | 10-0 |
|---|---|---|
| Value | 0 | RC10-RC0 |

— 1601

FIG. 16a Clock Pre-scaler Register

| Bit | 15 | 14-11 | 10-0 |
|---|---|---|---|
| Value | Enable | 0 | T10-T0 |

— 1611    — 1613

FIG. 16b Enable RCU Register

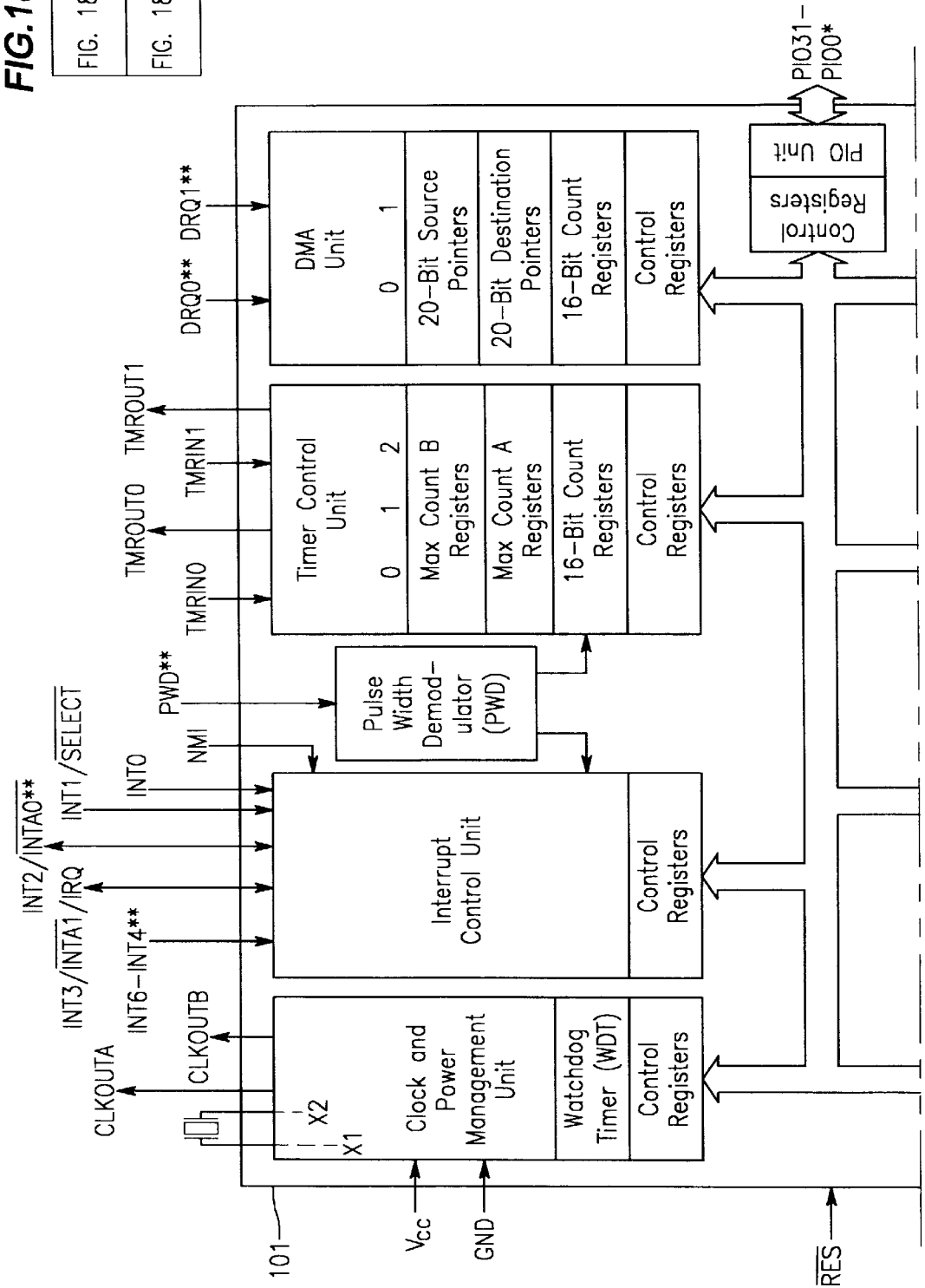

MULTIPLEXING DRAM CONTROL SIGNALS AND CHIP SELECT ON A PROCESSOR

CROSS-REFERENCE TO RELATED APPLICATIONS

This application relates to the following co-pending applications, Ser. No. 08/813,728, entitled "A METHOD AND APPARATUS FOR OVERLAPPING PERIPHERAL CHIP SELECT SPACE ON A MICROCONTROLLER WITH AN INTEGRATED DRAM CONTROLLER", by Gittinger et al.; Ser. No. 08/813,728, entitled "A METHOD AND APPARATUS FOR BANKING ADDRESSES FOR DRAMS", by Hansen et al.; and Ser. No. 08/813,734, entitled "A METHOD AND APPARATUS FOR ADDRESS MULTIPLEXING TO SUPPORT VARIABLE DRAM SIZES", by Hansen et. al., all of which were filed the same day as the present application and all of which are incorporated herein by reference.

BACKGROUND OF THE INVENTION

1. Field of the Invention

This invention relates to computers and more particularly to integrating a dynamic random access memory (DRAM) controller onto a microcontroller.

2. Description of the Related Art

Controllers for DRAMs are known in the art. In microcontrollers, various level of support for DRAMs has been provided. For example, the AM186™ES microcontroller provides support logic for refresh. Refreshing DRAMs is necessary to maintain the integrity of the DRAM contents, as is known in the art. However, DRAMs also typically require the address bus to be mulitplexed between rows and columns and require row and column address strobes (RAS and CAS), respectively indicating the presence of the row and column address on the bus. While prior art processors may include DRAM controllers, integrating a DRAM controller onto an existing microcontroller architecture that did not previously provide DRAM support can cause problems in, e.g., maintaining pin compatability with the existing microcontroller design. In the AM186™ES microcontroller, DRAM support logic external to the microcontroller is still required to provide, e.g., RAS/CAS signals and multiplexed address bits to the DRAM. Externally provided DRAM control logic requires additional parts and space. Further, externally provided DRAM support logic can result in slower access time to the DRAMs. Such slower access time can be accommodated by incorporating wait states into the bus cycles to give the external device time to, e.g., provide requested data. For example, the AM186™ES processor must insert wait states for DRAM access when the externally supplied clock speed of the microcontroller is, e.g., 40 MHz.

SUMMARY OF THE INVENTION

Accordingly, the invention incorporates a DRAM controller onto an existing microcontroller architecture. Existing chip select signals on the microcontroller which are asserted when an address is within a specific programmable address range provide RAS and CAS signals in a programmable DRAM mode and act as regular chip select signals when not in DRAM mode. The timing of the chip select signal signals is adjusted when the chip select signals are utilized as column and row address strobes. Additionally, multiplexed addresses and refresh control are provided from the microcontroller. A microcontroller according to one embodiment of the present invention supports both high byte and low byte access by providing an upper column address strobe signal (UCAS) to support access for high byte and word access and a lower column address strobe signal (LCAS) to support low byte and word access. Mid range chip selects may be used to provide the UCAS and LCAS signals. A lower chip select signal (LCS) may provide a first RAS signal which is active in a first DRAM mode. The LCS signal is asserted as a first RAS signal when an address is within a programmable memory range and the first DRAM mode is enabled. The programmable memory range for the first RAS signal is the lower half of memory, e.g., between 0 and 7FFFFh. A second RAS signal provides access to a DRAM mapped into the upper half of memory 80000h to FFFFFh. A mid range chip select is utilized to provide the second RAS signal. The upper memory chip select signal (UCS) is disabled when the second DRAM mode is enabled. In a further embodiment of the invention, an odd/even address multiplexing approach provides for flexibility in supporting DRAMs of varying sizes without complex hardware support on chip. The first and second DRAM modes as well as the address range for which the RAS/CAS and multiplexed addressing is provided are programmably selected. Further, the invention can support DRAMs of varying sizes. In a preferred embodiment, a glueless interface is provided to DRAMs as well as other memory products. That allows designers to more easily exploit the low cost of DRAM.

BRIEF DESCRIPTION OF THE DRAWINGS

The present invention may be better understood, and its numerous objects, features, and advantages made apparent to those skilled in the art by referencing the accompanying drawings, wherein, the use of the same reference symbols in different drawings indicates similar or identical items.

FIG. 2 shows the upper memory chip select register used to configure DRAM in the upper memory address space.

FIG. 3 shows the lower memory chip select register used to configure DRAM in the lower memory address space.

FIG. 4 shows a DRAM write cycle timing diagram without wait states.

FIG. 5 shows DRAM read cycle timing diagram without wait states.

FIG. 6 shows DRAM read cycle timing diagram with wait states.

FIG. 7 shows DRAM write cycle timing diagram with wait states.

FIG. 8b shows a logic circuit, including that shown in FIG. 8a, used to create the RAS and CAS signal according to the present invention.

FIG. 9 shows a timing diagram showing internal signals of a DRAM cycle with no wait states.

FIG. 10 shows a timing diagram showing internal signals of a DRAM cycle with wait states.

FIG. 16a shows a register (clock pre-scaler (CDRAM)) used to program the refresh cycle count.

FIG. 16b shows a register used to enable the refresh control unit.

DETAILED DESCRIPTION OF THE INVENTION

Figure 1:
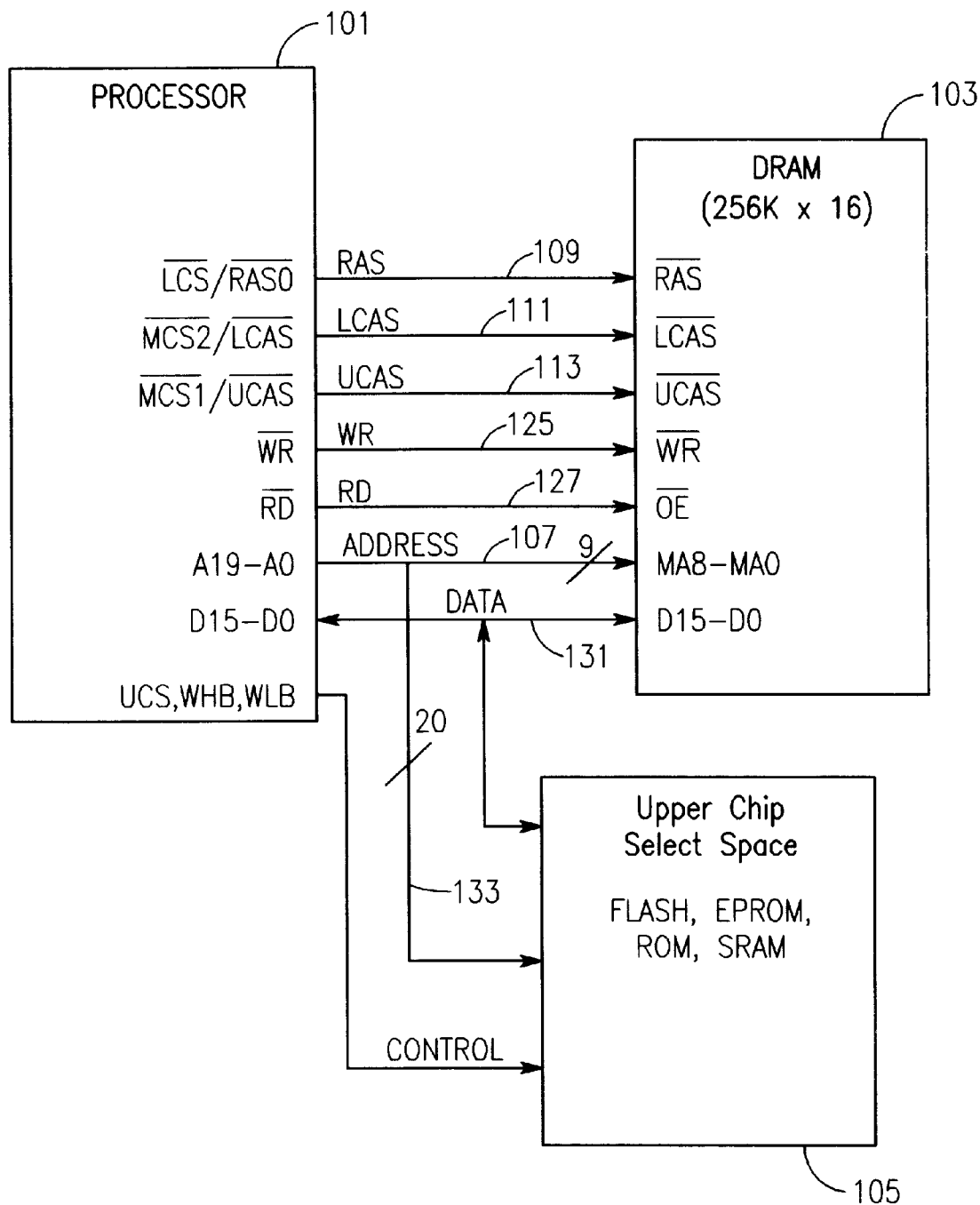
FIG. 1 shows a system in which '186 microcontroller, incorporating a DRAM controller according to the present invention, interfaces to a DRAM of 512 Kbytes.

FIG. 1 shows a system according to the invention that utilizes a '186 compatible microcontroller 103 (i.e., compatible with the 80186 microcontroller). Details of one example of a '186 microcontroller can be found in the Advanced Micro Devices data sheets for the AM186™ES (Publication #20002; Rev. A; Amendment/0; Issue Date: January 1996), the Am186EM and Am188™EM (Publication #19168 Rev. D Amendment /0; Issue Date: January 1996) and the "Am186™EM/188™EM User's Manual with Am 186 Family Instruction Definitions," which are incorporated herein by reference.

Processor 101, which incorporates a DRAM controller according to the present invention, supplies address, data and control signals to DRAM 103, including RAS 109 and LCAS and UCAS 111 and 113, read/write signals 127 and 125, address signals 107 and data signals 131. In the exemplary embodiment shown in FIG. 1, address signals 107 are a nine bit multiplexed address bus. DRAM 103 is shown in the exemplary embodiment as a 256K×16 DRAM. In addition to being coupled to DRAM 103, processor 101 can also be coupled to non-DRAM devices such as SRAM 105. Instead of multiplexed address bus 107 being provided to SRAM 105, a 20 bit address bus 133 is provided. Thus, for the address signals coming off processor 101, a subset of those address signals are physically supplied to DRAM 103.

A '186 compatible microcontroller can partition memory into various sized blocks which then can be selected using a variety of chip select signals that are provided on the microcontroller. The size of block and/or the starting address of the block are programmable. The chip select signals indicate that an address is within a particular address block and can be used to select, e.g., a particular device in an address range.

A typical '186 microcontroller can access 1 Mbyte of memory. A '186 microcontroller provides an upper memory chip select (UCS) signal indicating that an address is in an upper address space, i.e. in an address block in the upper half of the 1 Mbytes. The size of the address blocks selected by UCS in, for example, the AM186™ES, vary from 64 Kbytes to 512 Kbytes. A lower memory chip select (LCS) indicates that an address is in the lower memory region with a starting address of 00000h. In the AM186™ES, the block size for LCS ranges from 64 Kbytes to 512 Kbytes. Midrange chip selects with programmable starting addresses and block sizes are also available.

In order to provide RAS and CAS signals and maintain pin compatibility with existing '186 microcontrollers, the appropriate DRAM control signals may be multiplexed with existing signals provided from the '186 microcontroller which are not needed during a DRAM access.

In an embodiment which multiplexes the DRAM signals onto existing pins,, appropriate signals to multiplex with the DRAM signals must be determined. In one embodiment, the chip select signals are multiplexed with DRAM control signals. Other signals on a '186 may also be utilized such as DT/R (data transmit or receive) or $\overline{DEN}/DS$ (data enable). If chip selects are used, one such signal that could be used is the LCS signal, which is active during an access to addresses within the lower 512 Kbytes of memory and can be multiplexed with a RAS signal. In one embodiment a second RAS signal is provided. LCS is multiplexed with RAS0 and MCS3 is multiplexed with RAS1. Note that references herein to the chip select signals and row and column address strobes sometimes includes the active state of the signal (e.g. $\overline{LCS}$, which indicates that the signal is active low). Those signals will generally be referred to herein without an indication of their active level unless where necessary to better understand logic relationships.

A '186 microcontroller provides both high byte and low byte access as well as word access. Accordingly, column strobes for both high byte and low byte access may be provided if both high byte and low byte access is supported for the DRAM controller. In one embodiment which supports high byte and low byte access, the column address strobes are provided by the midrange memory chip selects (MCS2 and MCS1) which convert, respectively, to LCAS and UCAS. LCAS asserts for a low byte access and UCAS asserts for a high byte access. Both the LCAS and UCAS signals assert for a word access. Of course, different chip select signals, or other signals entirely, may also be multiplexed with the row and column address strobes.

In one embodiment, the DRAM may be mapped into either the lower or upper memory. If mapped into the lower memory, then RAS0 is asserted to access that DRAM. If mapped into the upper memory, RAS1 is asserted for DRAM access. The DRAM may be mapped into an address space like any other chip select. For instance a DRAM could be selected to be in the lower 512 Kbytes. Then, RAS would be asserted when an address decoder, such as the one used for LCS, decodes that the address is in that address range. The CAS signals will assert whenever an address within the address range for the RAS signal is accessed.

Referring again to FIG. 1, DRAM 103 is mapped into the lower chip select space. When an access occurs to an address within the lower 512 Kbyte address space, RAS, LCAS and UCAS assert to provide the appropriate control signals to DRAM 103.

Internal control registers may be provided to configure the DRAM control appropriately. For instance, block size into which the DRAM is mapped needs to be configured. Additionally, the address space needs to be designated as DRAM address space. Referring to FIG. 2, the upper memory chip select register (UMCS) 200 is shown. The register is located at offset A0h. The upper memory chip select register is used when the DRAM is mapped into the upper memory address space, i.e., the upper 512 Kbytes. The (LB2–LB0) bits 201 define the lower bound of the memory block accessed through the UCS chip select as shown in Table 1. For example when LB2–LB0 are 111, the memory block is F0000h–FFFFFh.

TABLE 1

| Memory Block Size | Starting Address | LB2–LB0 |
| --- | --- | --- |
| 64K (Default) | F0000h | 111b |
| 128K | E0000h | 110b |
| 256K | C0000h | 100b |
| 512K | 80000h | 000b |

Other numbers of bits may be utilized to select other block sizes in other embodiments. Referring again to FIG. 2, the UCS DRAM enable bit (UDEN) bit (bit 6) 203 selects the UCS space as DRAM space. When UDEN is set to 1, the MCS3 pin becomes RAS1, and the MCS1 and MCS2 pins become UCAS and LCAS, respectively. Thus, RAS1, UCAS and LCAS would assert when an access is made to an address in the block in the upper address space selected by LB2–LB0. The Disable Address bit (DA) 205 enables or disables the AD15–AD0 bus during the address phase of a bus cycle when UCS is asserted. The AD15–AD0 signals are a bus on which both data and address is time multiplexed. That bus should be distinguished from the multiplexing of address information on an address bus as required by DRAM. The AD bus is not effected by the state of the UDEN bit. When UDEN is set to 1 the UCS pin is held high (inactive). On initialization the UCS pin can be active to allow the system to boot from a non-volatile memory, using the UCS pin, and then switch UCS space to a DRAM after system initialization. A '186 processor typically boots from a memory location located in the upper address space. The DA bit is still valid when the UDEN is set. That is, even though the UCS pin is held high in DRAM mode, the address phase on AD15–AD0 will still be disabled during DRAM accesses to UCS space if DA is set to 1.

The block size programmed in LB2–LB0 preferably should match the size of the DRAM being used, otherwise the full capacity of the DRAM may not be utilized. The ready mode bit (R2) 207 configures the ready mode for the UCS chip select. If R2 is set to 0, external ready is required, i.e., an external handshake is required. If R2 is set to 1, the external ready is ignored. In one embodiment, DRAM is only supported to ignore the external ready condition. The two bits R1 and R0 determine the number of wait states to insert during an access to the UCS space. Zero to three wait states may be inserted in one embodiment. In one embodiment, the UMCS register is at offset A0h.

An internal control register may also designate the block size in the low memory address space and whether that designated block is DRAM address space. Referring to FIG. 3, the lower memory chip select (LMCS) register 300 is shown. The register is located at offset A2h. Bits UB2–UB0 define the upper bound of the memory accessed through the LCS chip select as shown in Table 2.

TABLE 2

| Memory Block Size | Ending Address | UB2–UB0 |
| --- | --- | --- |
| 64K (Default) | 0FFFFh | 111b |
| 128K | 1FFFFh | 110b |
| 256K | 3FFFFh | 100b |
| 512K | 7FFFFh | 000b |

Other number of bits may be utilized to select other block sizes in other embodiments. The LCS DRAM enable bit (LDEN) bit 301 selects the LCS space as a DRAM address space. When LDEN is set to 1, the LCS signal becomes RAS0, and the MCS1 and MCS2 pins become UCAS and LCAS, respectively. The block size programmed in UB2–UB0 preferably should match the size of the DRAM being used, otherwise the full capacity of the DRAM may not be utilized. The Disable Address bit 7 (DA), the ready mode bit 2 (R2) and the bits R1 and R0 are the same as for the UMCS register 200.

Referring again to the exemplary embodiment in FIG. 1, the lower and upper memory block sizes are 512 Kbytes. MCS2 and MCS1 convert, respectively, to LCAS and UCAS when the lower memory DRAM enable bit (LDEN) is set in the lower memory chip select register (LMCS). For the embodiment shown in FIG. 1, the upper boundary bits UB2–UB0 are 000 to select a 512 Kbyte address block. The upper 512 Kbytes in UCS space 105 in FIG. 1 can be utilized by memories such as Flash, EPROM, ROM, SRAM which do not require a multiplexed address bus. Alternatively, a DRAM could also be utilized in the upper 512 Kbytes. Only nine address lines are required for DRAM 103. Nine multiplexed address lines provide 18 bits of address which is 256 Kbytes. The high and low column address strobes LCAS and UCAS provide the extra bit needed for the 512 Kbyte address block.

The determination whether to assert the RAS and CAS signals when DRAM mode is enabled (LDEN, UDEN or both) is based on the value of the address being accessed. For example, the processor determines if the LCS address space is being selected. If so, and if that block is designated as DRAM, the RAS/CAS strobes are asserted appropriately. The logic for determining if the LCS address space is being selected can be the same logic as already exists in the '186 for LCS. If a DRAM mode is also enabled, LDEN or UDEN, those signals are used to appropriately adjust the timing to output the DRAM control signals.

The timing for the output of the RAS/CAS signals may be different than for the LCS, UCS and MCS signals. The timing for the read and write signals is the same as for prior '186 designs without an integrated DRAM controller. FIG. 4 shows the timing for a DRAM write cycle with no wait states. The RAS signal is asserted during the first phase (PH1) of the T1 clock period. In contrast, the LCS and UCS signals are normally asserted one cycle earlier (PH1 in T4) when not in DRAM mode. The CAS signal shown in FIGS. 4–7 represents the timing for both LCAS and UCAS. Note that the clock shown in those figures, CLKOUTA, is an output of a '186 microcontroller. CLKOUTA relates to internal clocks as shown in FIG. 5, where CLOCKOUTA is shown to be the same as a PH2 clock with the opposite phase of a PH1 clock. FIG. 5 shows a DRAM read cycle timing diagram according to the invention. FIG. 6 shows a DRAM read cycle timing with wait states inserted at time TW. The speed that the processor operates at and the DRAMs utilized will affect the wait states. FIG. 7 shows a DRAM write cycle timing diagram with wait states inserted at time TW. As discussed, the wait states can be programmed by writing to the two least significant bits in the LMCS and UMCS registers. The number or wait states that should be programmed into the LMCS and UMCS registers depends upon such factors as operating frequency of the microcontroller as well as the access speeds of the DRAMs utilized.

Figure 8A:
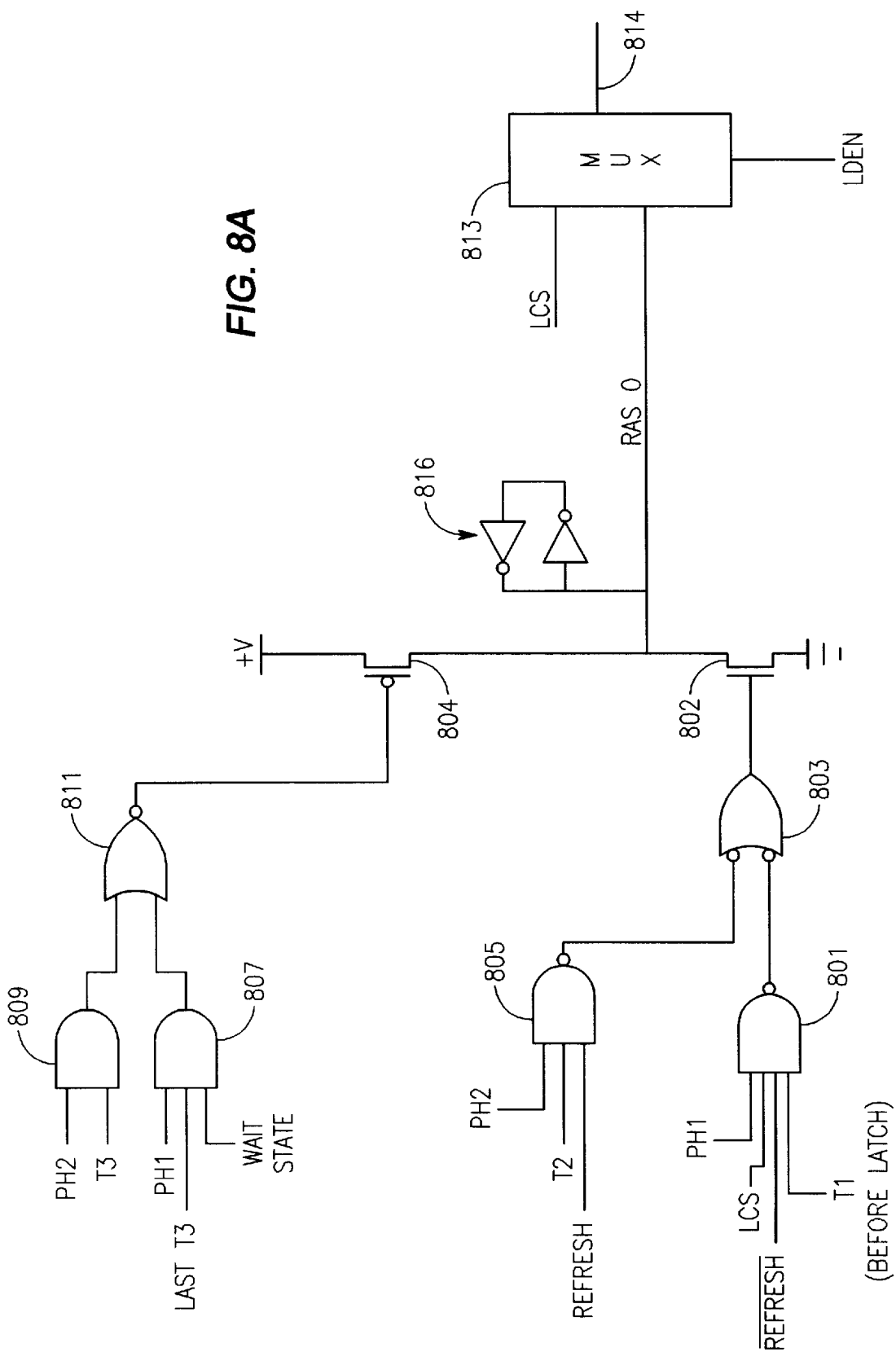
FIG. 8a shows a logic circuit used to create RAS0.

One implementation of a circuit to provide the RAS and CAS signals according to the timing diagrams shown in FIGS. 4–7 is shown in FIG. 8a. LCS is provided to gate 801. LCS is determined to be active in a circuit that compares the programmed LCS block size from the lower memory chip select register with the current address and asserts LCS if the address is within the LCS block. Such circuits are known in the art and exist on, e.g., prior art '186 microcontrollers.

When LCS and LDEN are both asserted and refresh is not asserted and it is phase 1 of time T1 then gate 801 outputs a 0 which causes gate 803 to output a 1 which causes transistor 802 to switch on and RAS to be asserted low. That low value is held by latch 816. The RAS0 signal is provided to multiplexer 813 which selects RAS0 as output signal 814 when LDEN is asserted. Otherwise, when not in a DRAM mode (LDEN not asserted), multiplexer 813 provides the LCS signal as output signal 814. Using the above described logic, RAS0 is asserted in phase 1 of the T1 cycle as shown in FIG. 4. FIG. 4 also shows that RAS should be desasserted in PH2 of T3 (without waits states). That is provided by gate 809 which ANDs PH2 and T3. The output of 809 causes a 0 to be provided from gate 811 to transistor 804 which forces RAS0 and latch 816 to a high value (+V). Gate 807 adjusts the deassertion of RAS when wait states are used to occur in PH1 rather than PH2.

FIG. 8b shows the circuit of FIG. 8a and in addition circuitry that provides RAS1, CAS low (CASL) and CAS high (CASH) and the UCS signal. Latches 820–823 store respectively, the T1 through T4 signals and the latches are clocked by the PH1 clock edge. The T1–T4 signals are updated on a PH2 clock edge. Therefore, when a logic gate needs to guarantee the stability of one of the T1–T4 signals during PH2, the signal after the latch is supplied, e.g. T3 to gate 809. When a logic gate needs guaranteed stability of T1–T4 during a PH1 cycle, as does, e.g., gate 807, the signals are taken before the latches. In other words, a signal clocked by PH2 is stable during PH1 and vice versa.

The RAS1 signal, output by multiplexer 830 when UDEN is asserted, is generated in a manner similar to the RAS0 signal. Gates 805, 817 and 819 are used to assert RAS1 and gates 809, 811 and 807 are used to deassert RAS1. Note that when UDEN is asserted, multiplexer 831 outputs a high value for UCS (inactive).

Figure 8C:
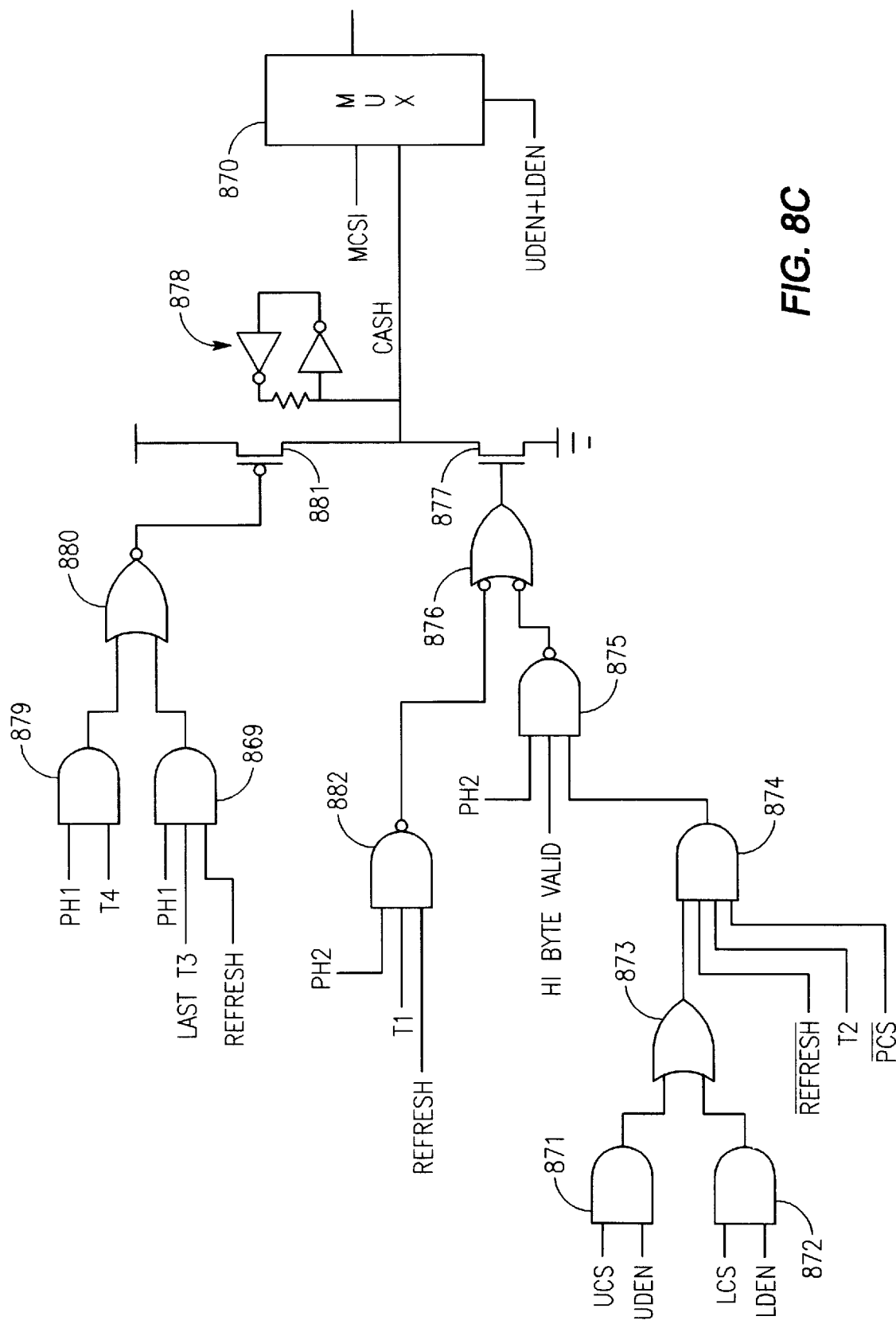
FIG. 8c shows logic circuit details from FIG. 8b used to generate CASH.

FIG. 8c isolates the generation of the CASH signal in FIG. 8b. CASH is output by multiplexer 870 when either UDEN or LDEN is asserted. CASH, which is asserted for high byte and word accesses, is asserted during PH2 of T2 as shown in FIG. 4. Gates 871, 872 and 873 determines if either UCS and UDEN are asserted or LCS and LDEN are asserted. Gate 873 supplies gate 874 which outputs a high value when 873 is high and refresh is inactive and PCS is inactive and T2 is active. Gate 874 supplies gate 875 which outputs a high value when gate 874 is active and HI BYTE VALID is active and PH2 is active. HI BYTE valid is an indication that the instruction is either a word or high byte access. If all the inputs to 875 are high, then the output from 875 causes gate 876 to output a high value switching on transistor 877, causing a 0 to be latched into 878. CAS is deasserted in PH1 of T4 which is controlled by gate 879 and 880 when not in a refresh mode. During PH1 of T4 880 will caused switch 881 to turn on causing a high voltage to appear on CASH and to be latched into 878.

Referring back to FIG. 8b, the circuit to generate CASL is similar to generating CASH except that the LOW BYTE VALID signal is used instead of HIGH BYTE VALID.

Because slower DRAMs, e.g., 60 nanosecond (ns) and 70 ns DRAMs, require more RAS high time between cycles than faster DRAMs, when wait states are inserted, as shown in FIGS. 6 and 7, the RAS signal is brought high in the first half of the T3 clock cycle rather than in the second half when there are no wait states as shown in FIGS. 6 and 7. That provides additional time for the inactive time for RAS between cycles for the slower DRAMs.

Figure 11:
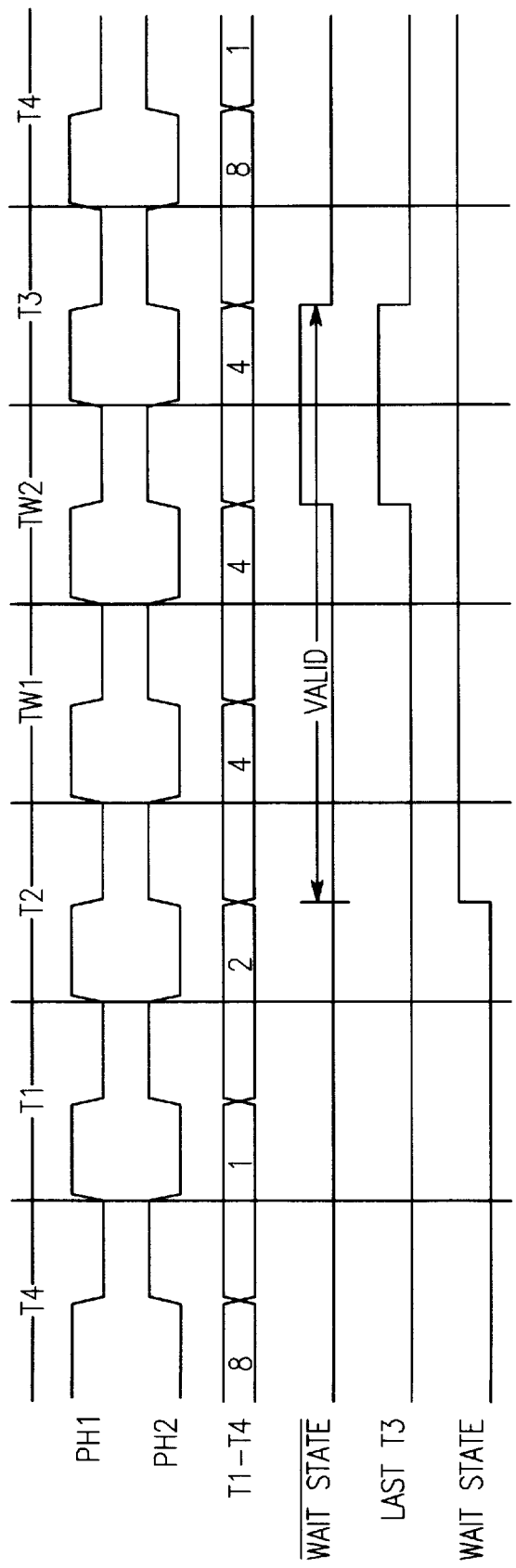
FIG. 11 shows a timing diagram of a DRAM cycle with 2 wait states.
Figure 12:
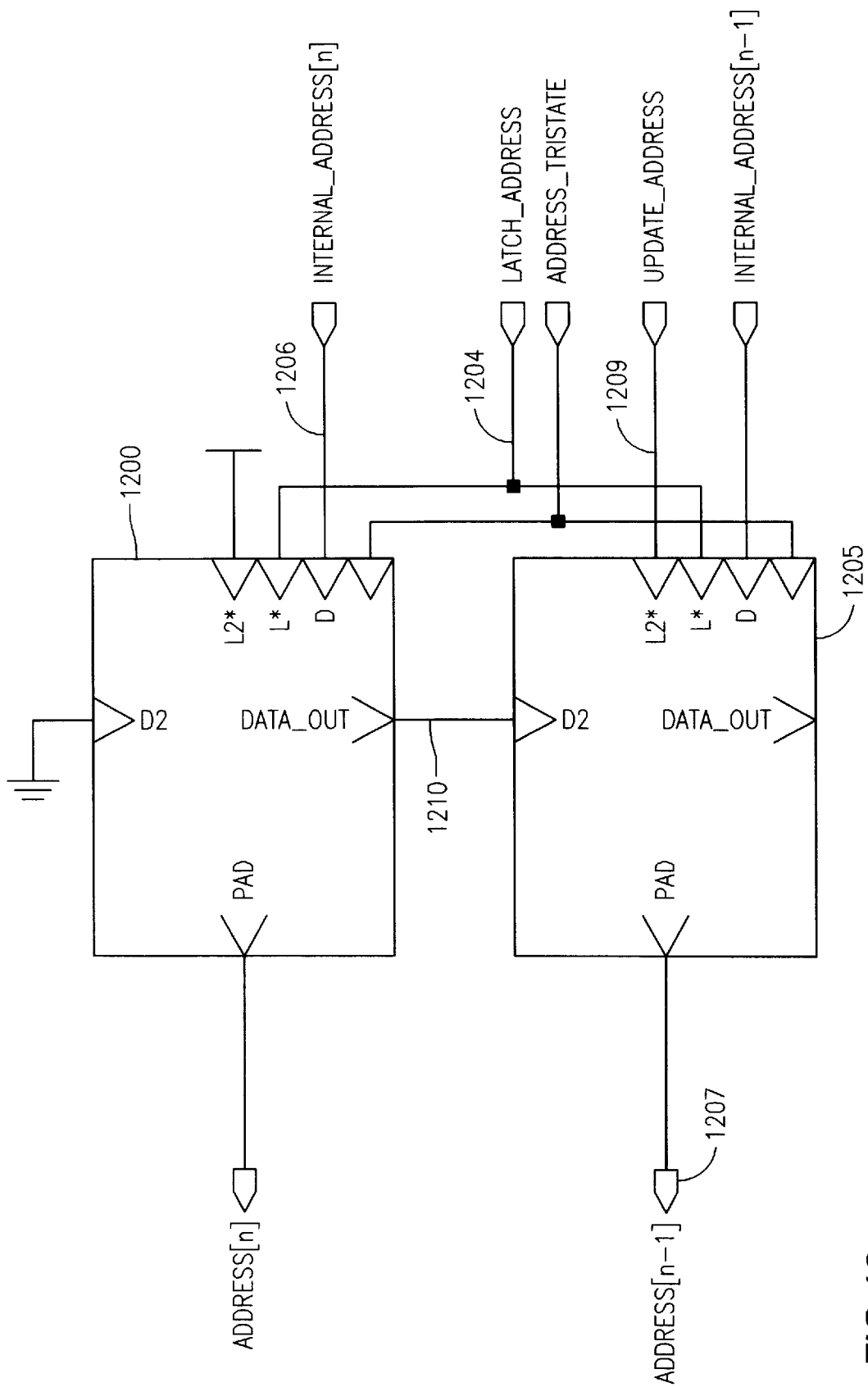
FIG. 12 shows a block diagram of an output circuit used to implement addressing according to the present invention.

When wait states are active, T3 is kept asserted. The T1–T4 signals 893 are four bits, with one bit asserted for each T cycle. Thus, as shown in FIGS. 9, 10 and 11, T1 is indicated by a 1 on the four bits, T2 by a 2, T3 by a 4 and T4 by an 8. $\overline{\text{WAIT STATE}}$ signal 840 in FIG. 8b is also shown in FIG. 9, 10 and 11. The signal is only valid during T3 cycles when a value of 4 is on the T1–T4 bits. When there are no wait states as shown in FIG. 9, $\overline{\text{WAIT STATE}}$ is inactive high during PH2 of T2 and PH1 of T3. If wait states are present, as shown in FIG. 10, in order to block inadvertent deassertion of RAS through gate 807 during, AND gate 890 block T3 until $\overline{\text{WAIT STATE}}$ is inactive (high). In other words, the circuit distinguishes between T3 during wait states and the T3 cycle that directly precedes a T4. Thus, $\overline{\text{WAIT STATE}}$, which changes on PH2, goes high (inactive) during the PH2 of the last wait state. Referring to FIG. 12, that would be the second wait state (TW2). $\overline{\text{WAIT STATE}}$ going high indicates to AND gate 807 that a real T3 cycle (as opposed to a wait state T3) is coming up. $\overline{\text{WAIT STATE}}$ from latch 892, is still active since it is latched only on a T2. Thus, gate 807 will cause RAS to deassert during PH1 of T3. Remember that wait states are programmably set in the UMCS or LMCS register. When no wait states are inserted, $\overline{\text{WAIT STATE}}$ rises on PH2 of T2 to indicate an inactive state and deasserts on PH2 of T3.

In additional to supplying data and control signals, a processor with an embedded DRAM controller must also provide addresses. In one embodiment, processor 101 supplies odd/even multiplexed addresses to DRAM 103 in order to support varying DRAM sizes as shown in Table 3 and Table 4. An odd/even address multiplexing approach according to one embodiment of the invention is shown in Table 3. Note that every odd address pin is driven as a row address and every even address pin is driven as a column address. Each address bit is multiplexed with its nearest neighbor onto a single output pin. For instance, address pins A1 and A0, A3 and A2, A5 and A4, etc., are multiplexed onto one address pin for each pair. For this embodiment, the odd pins are coupled to address pins MA9–MA0 of DRAM 103. Note that all even processor pins could be coupled to the DRAM instead. Additionally, all even address bits could be provided as row addresses and the odd addresses would be column addresses.

TABLE 3

| DRAM PIN | MA9 | MA8 | MA7 | MA6 | MA5 | MA4 | MA3 | MA2 | MA1 | MA0 |
| --- | --- | --- | --- | --- | --- | --- | --- | --- | --- | --- |
| PROC PIN | A19 | A17 | A15 | A13 | A11 | A9 | A7 | A5 | A3 | A1 |
| ROW ADDR | A19 | A17 | A15 | A13 | A11 | A9 | A7 | A5 | A3 | A1 |
| COL ADDR | A18 | A16 | A14 | A12 | A10 | A8 | A6 | A4 | A2 | A0 |

An alternative embodiment is shown in Table 4 where the column address (e.g., A18) is the adjacent address above the row address (A17) address rather than the adjacent address below as in Table 3. Note that the most significant address bit is driven twice because for that embodiment A19 is the most significant bit.

TABLE 4

| DRAM PIN | MA9 | MA8 | MA7 | MA6 | MA5 | MA4 | MA3 | MA2 | MA1 | MA0 |
|---|---|---|---|---|---|---|---|---|---|---|
| PROC PIN | A19 | A17 | A15 | A13 | A11 | A9 | A7 | A5 | A3 | A1 |
| ROW ADDR | A19 | A17 | A15 | A13 | A11 | A9 | A7 | A5 | A3 | A1 |
| COL ADDR | A19 | A18 | A16 | A14 | A12 | A10 | A8 | A6 | A4 | A2 |

Alternatively, sequential addresses may be provided as DRAM addresses as shown in Tables 5 or 6 or some combination of multiplexed and sequential addresses.

TABLE 5

| DRAM PIN | MA8 | MA7 | MA6 | MA5 | MA4 | MA3 | MA2 | MA1 | MA0 |
|---|---|---|---|---|---|---|---|---|---|
| PROC PIN | A18 | A17 | A16 | A15 | A14 | A13 | A12 | A11 | A10 |
| ROW | A18 | A17 | A16 | A15 | A14 | A13 | A12 | A11 | A10 |
| COLUMN | A9 | A8 | A7 | A6 | A5 | A4 | A3 | A2 | A1 |

As shown in Table 5, address bits A18 and A9 are provided on the same pin processor pin (A18) to DRAM pin (MA8).

For a different size DRAM, e.g., 1 Mbyte, a 20 bit address may be multiplexed as shown in Table 6.

TABLE 6

| DRAM PIN | MA9 | MA8 | MA7 | MA6 | MA5 | MA4 | MA3 | MA2 | MA1 | MA0 |
|---|---|---|---|---|---|---|---|---|---|---|
| PROC PIN | A20 | A19 | A18 | A17 | A16 | A15 | A14 | A13 | A12 | A11 |
| ROW ADDR | A20 | A19 | A18 | A17 | A16 | A15 | A14 | A13 | A12 | A11 |
| COL ADDR | A10 | A9 | A8 | A7 | A6 | A5 | A4 | A3 | A2 | A1 |

From Tables 5 and 6, it becomes clear that a DRAM controller needs to support a different address multiplexing scheme for the 20 bit address as for the 18 bit address when sequential addressing is used. For instance, address line A10 has become a column address in Table 6 as compared to a row address in Table 1. Further, address line A10 is multiplexed onto pin A20 rather than A10. Additionally, all the other pairs of address bits multiplexed onto an address line have also changed. Thus, the DRAM controller may need to provide different configurations in order to support different sizes of DRAMs if sequential address mulitiplexing is used.

In order to provide multiplexed addresses to the DRAM, a multiplexing circuit is provided in one embodiment of the invention. FIG. 12 shows a block diagram of an output circuit that can be utilized to implement the instant invention. The output circuit shown in FIG. 12 can be used to multiplex an address bit with its nearest neighbor to provide row and column addresses. Block 1205 provides output address (n−1) and is physically coupled to a DRAM address pin. Block 1200 outputs address bit (n) but is not coupled to the DRAM. However, block 1200 outputs internal address (n) as an address to a device or devices that do not have a multiplexed address. Block 1200 also provides the address (n) over signal line 1210 to block 1205. Latch_Address signal (L*) functions as a strobe which outputs row addresses for the RAS cycle. Thus, when L* is asserted and appropriate clocks (not shown) are provided, the internal address (n−1) is output from block 1205 onto address pin 1207. The update address signal 1209 (L2*) functions as a strobe which outputs column addresses. Thus, L2* functions as a multiplexer select by selecting the D2 data received from block 1200 (address bit n) for output on pin 1207.

A pair of identically configured blocks 1200 and 1205 may be provided for every pair of output bits. Thus, for a processor providing 20 address bits, 10 such pairs would exist. Thus, the processor could provide 20 odd/even multiplexed address bits on the 10 signal lines. In another embodiment, block 1205 could be connected at 1210 to its immediate neighbor below rather than above it. That is, block 1205 could output (n+1) when L* is asserted rather than (n−1). Rather than mulitplexing in the nearest neighbor onto an address pin to provide mulitplexed addresses, it would be possible to muliplex in any address pin. Thus, the RAS cycle could provide, e.g., the 10 most significant bits and the CAS cycle could supply the 10 least significant bits as shown e.g., in Table 4.

Figure 13:
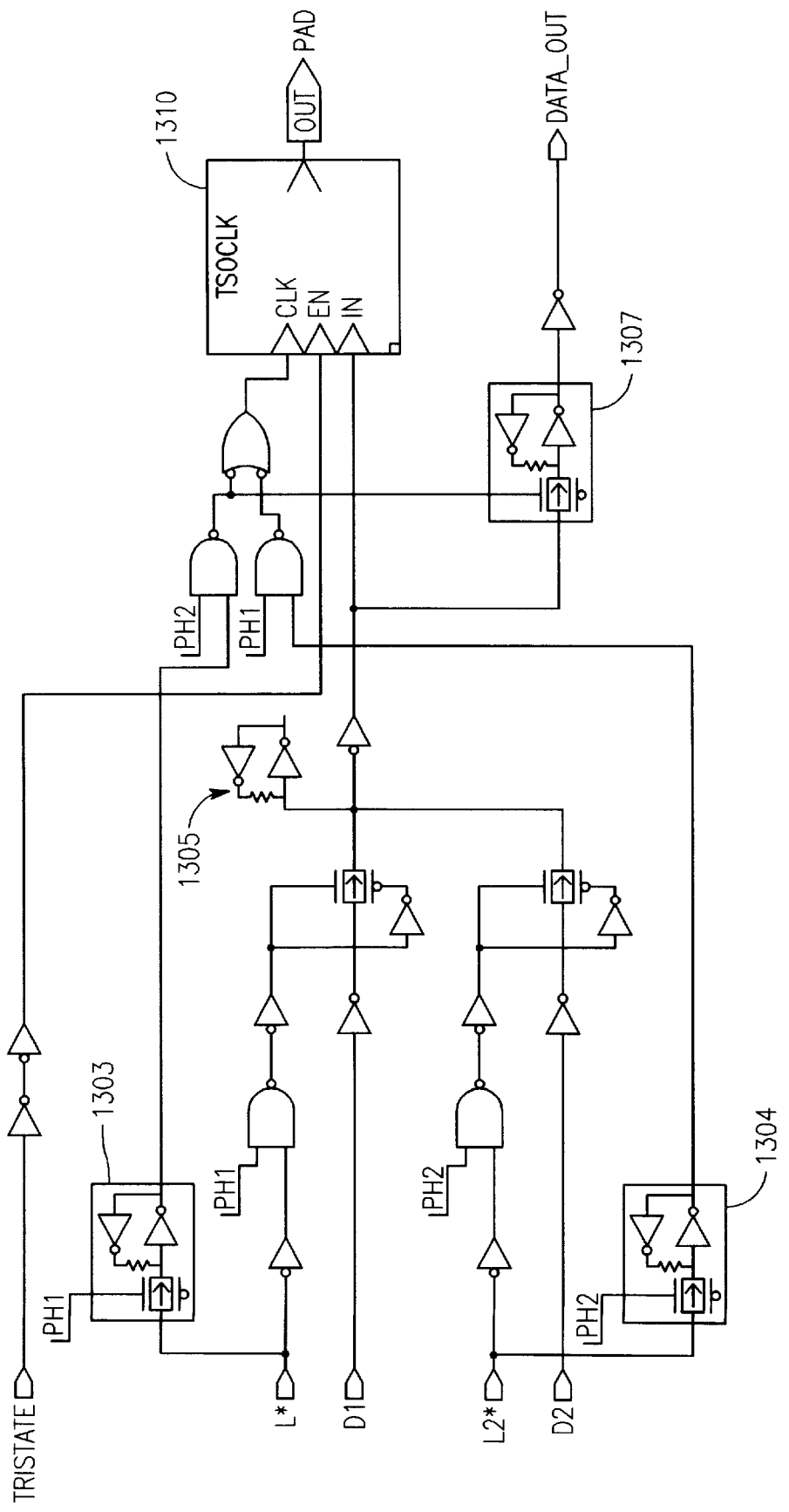
FIG. 13 shows additional details of an output circuit that can be used in one embodiment of the present invention to provide multiplexed addressing to the DRAM.
Figure 14:
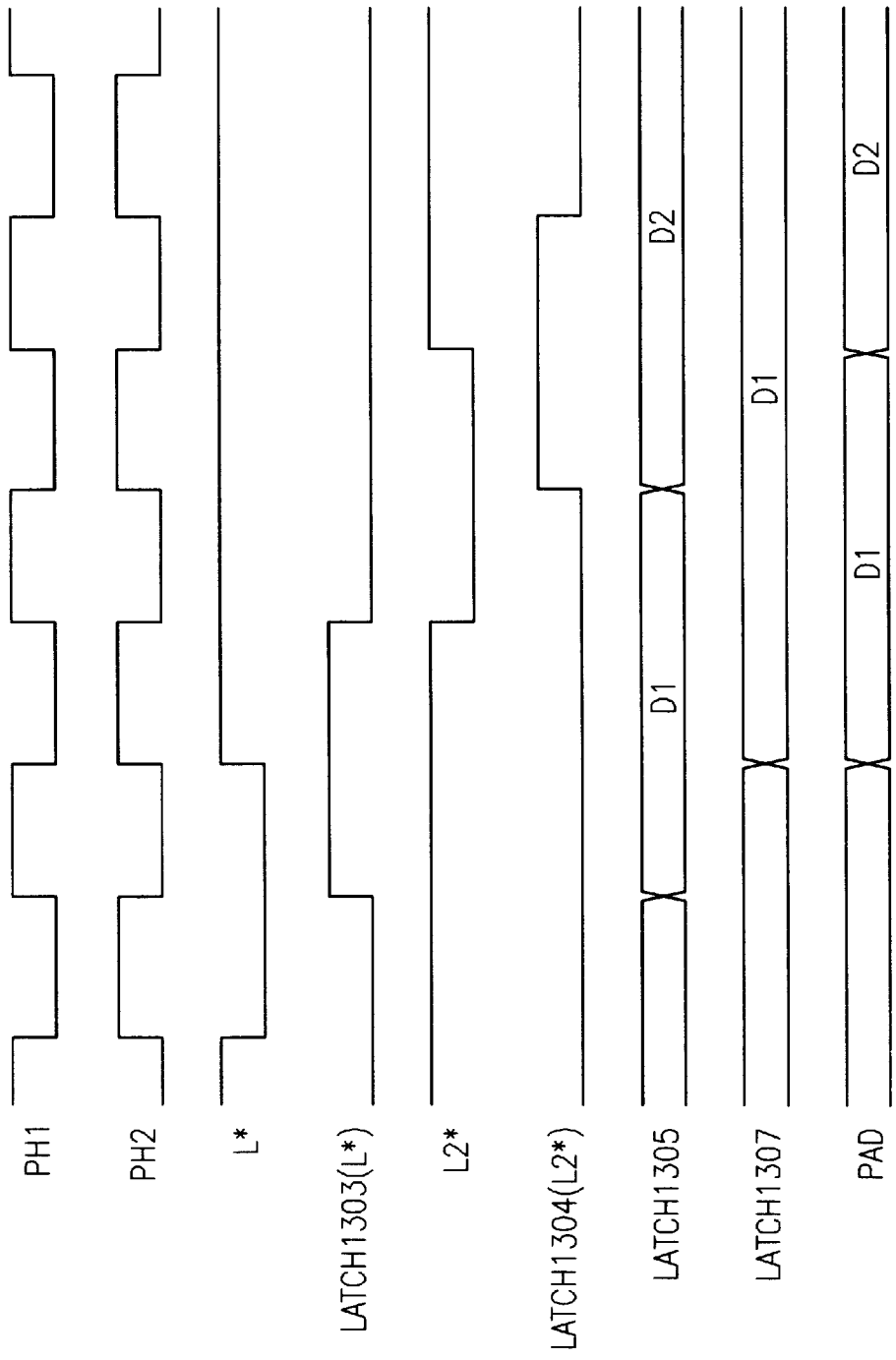
FIG. 14 shows a timing diagram of the operation of the circuit in FIG. 13.

FIG. 13 shows greater detail of one implementation of the block 1205 (which is the same as block 1200). D1 corresponds to address (n−1) of FIG. 12. PH1 and PH2 are clock inputs. During a first time period, the output cell 1310 will drive D1 and during a second time period the output cell 1310 will drive D2. A representative timing diagram of the operation of the logic shown in FIG. 10 is provided in FIG. 14 . FIG. 14 shows the values in latch 1303, which latches in L* (the strobe for the RAS cycle), latch 1305, latch 1304, which is L2* latched, and latch 1307 which provides DATA_OUT to its neighbor block D2 input. Referring back to FIG. 8b, note that L2* is provided by gate 895.

Multiplexing in column addresses onto the row pins allows the SRAM address and the row address of the DRAM to be driven without having to know in what address space (e.g., upper or lower) the address resides. That is, the decode of the address can take place while the row address is being driven and it is being determined whether or not the address space is DRAM requiring multiplexing of the address. For designs incorporating DRAM and other memories such as SRAM, that allows the addresses for DRAMs and SRAMs to be output as soon as the address is available.

Figure 15:
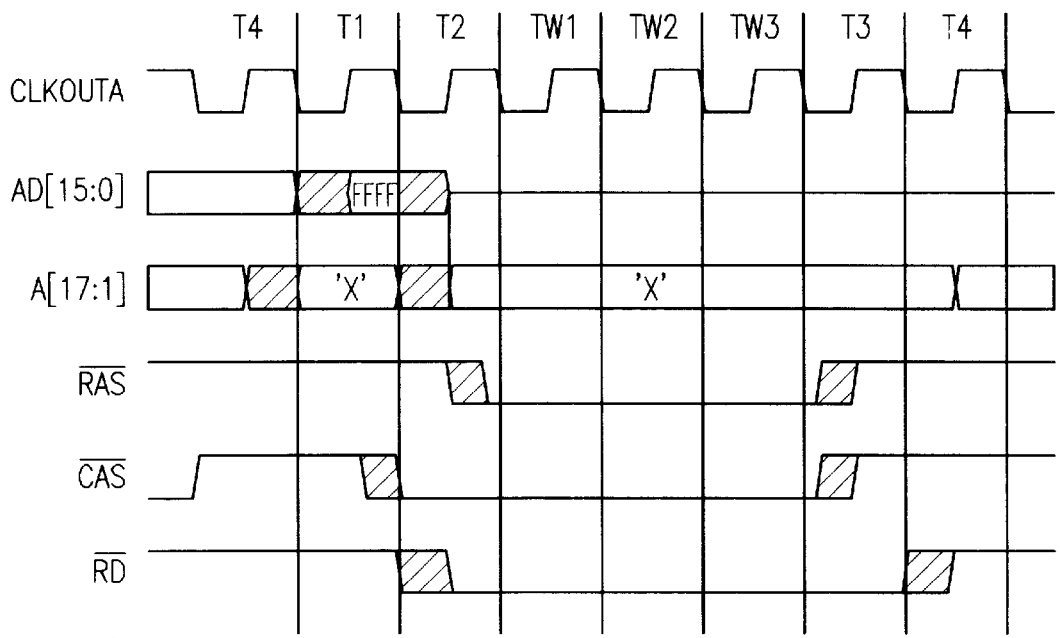
FIG. 15 shows a timing diagram of a DRAM refresh cycle.

Refresh control logic is also incorporated in the DRAM controller in accordance with the present invention. Many forms of refresh are known in the art and are contemplated as being within the teachings of the present invention. One embodiment of the present invention supports CAS before RAS refresh. FIG. 15 illustrates a timing diagram in accordance with the present invention implementing CAS before RAS refresh. In such a refresh, internal counters in the DRAMs are used to cycle through the row addresses for the refresh.

An exemplary embodiment of refresh support is as follows. During a refresh cycle the AD bus will drive the address to FFFFh, which prevents PCS and MCS from asserting inadvertently. The PCS and MCS decode should not contain the address FFFFFh. The UCS signal does not assert during a refresh cycle. If two banks of DRAM are being used (i.e. RAS0 and RAS1) in a system, then both banks may be refreshed at the same time. In one embodiment a programmable register contains the desired clock count interval between refresh cycles. For instance, the clock pre-scaler register (CDRAM) register (offset E2h), shown in FIG. 16a provides that function. The register contains 11 bits 1601 for the refresh interval reload value (RC10–RC0) to specify the clock count interval shown, e.g., in Table 6. A refresh counter with 11 bits has a maximum timer count that will reach 51.2 microseconds when the counter is clocked at 40 Mhz. The counter value may be set to 12h or greater to ensure that the there are sufficient cycles for the processor to execute code. In a power-save mode, where the processor clock is divided to provide a slower clock rate, the refresh counter may need to be adjusted to take into account the reduced processor clock rate.

In an exemplary embodiment, the normal refresh rate on a DRAM is assumed to be 15.2 microseconds. That refresh rate allows each row address to be refreshed at the required rate. Some DRAMs may have special refresh rates for low power DRAMs and special considerations. Table 6 illustrates typical values that a programmer might want to use for time intervals to be placed into the desired clock counter interval in the exemplary embodiment.

TABLE 6

| Frequency | CDRAM (hex value) | CDRAM (decimal value) | Refresh Interval Time |
|---|---|---|---|
| 40 Mhz | 7FFh | 2048 | 51.2 us |
|  | 270h | 624 | 15.6 us |
| 33 Mhz | 7FFh | 2048 | 61.44 us |
|  | 208h | 520 | 15.6 us |
| 25 Mhz | 7FFh | 2048 | 81.92 us |
|  | 186h | 390 | 15.6 us |
| 20 Mhz | 7FFh | 2048 | 102.4 us |
|  | 138h | 312 | 15.6 us |

The refresh feature is not enabled until a control register is written. For example, an Enable Refresh Counter unit register (EDRAM, offset E4h) shown in FIG. 16b, includes an enable bit 1611 to enable refresh as well as 11 bits indicating the present value of the down counter 1613.

Referring again to FIG. 8c, the circuit controlling generation of CASH during refresh is shown. A counter (not shown) is loaded up with the count value from the CDRAM register. When the counter reaches 0, REFRESH becomes active and is supplied to the circuit shown in FIGS. 8a, 8b and 8c. Note that assertion of refresh causes three wait states to be inserted. Referring to FIG. 8c, CASH will be asserted, as shown in the timing diagram of FIG. 15, when PH2, T1 and REFRESH are asserted. Those signals are ANDed in gate 882 causing switch 887 to turn on, thus asserting CASH. CASH is turned off in PH1 of T3 during refresh which is provided by gate 869. The logic for CASL works similarly. Referring to FIG. 8a, RAS0 is asserted during refresh by gate 805 causing transistor 802 to turn on. RAS0 is deasserted during PH1 of T3 by gate 807 since 3 wait states are utilized during refresh. The logic for RAS1 works similarly.

Figure 17:
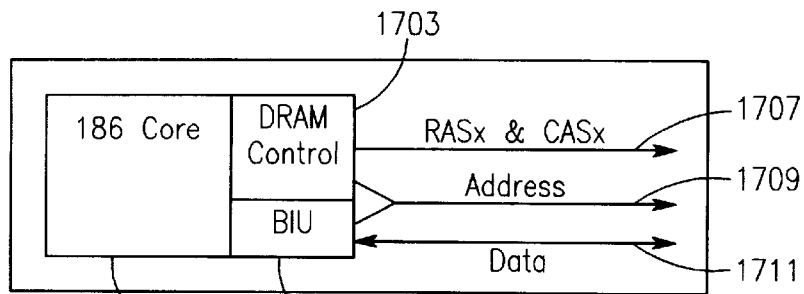
FIG. 17 shows a '186 microcontroller according to the present invention.
Figure 18B:
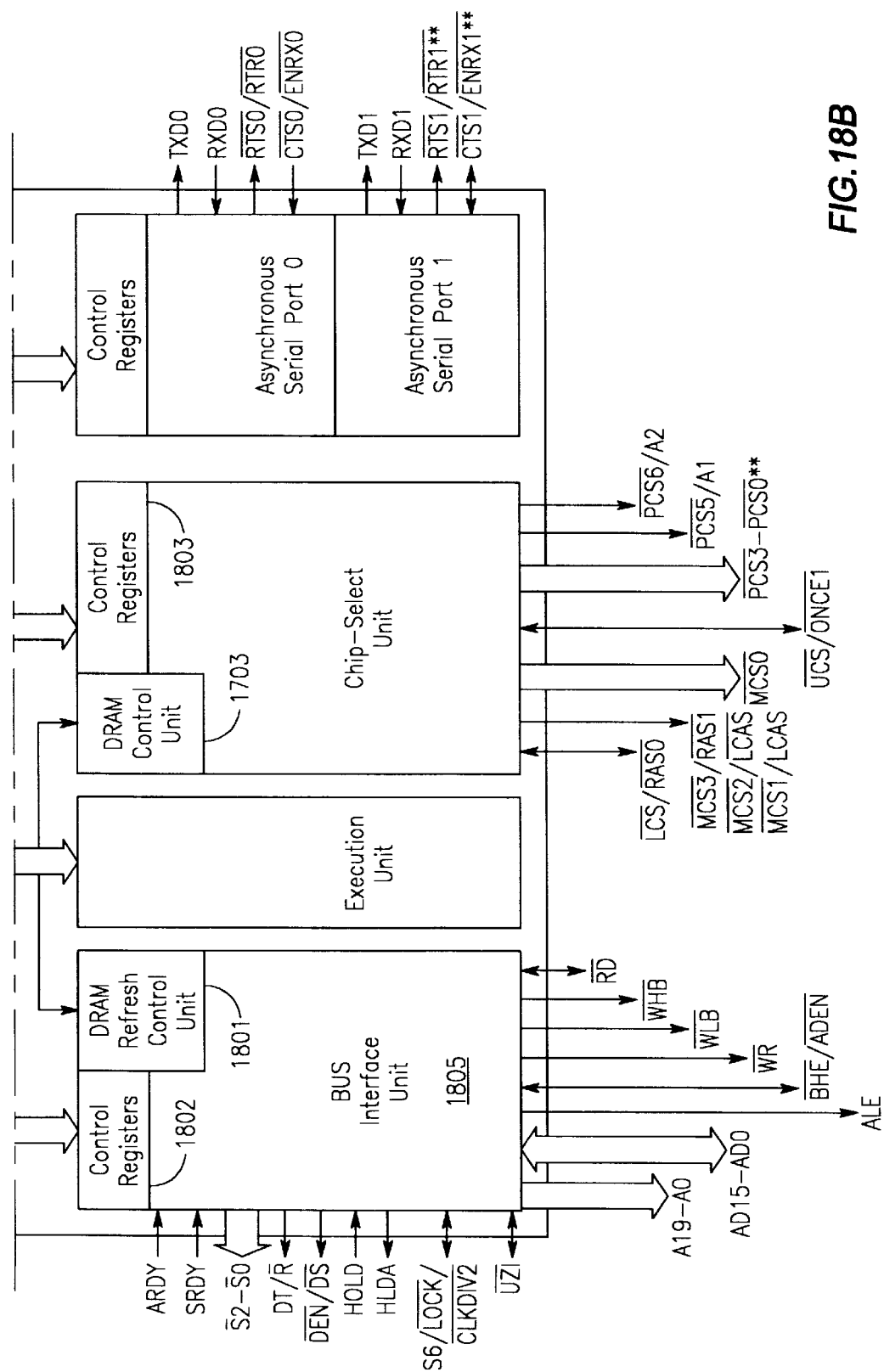
FIG. 18 shows further details of a '186 microcontroller integrating a DRAM controller according to the present invention.

A block diagram of '186 processor 101 according to the present invention is shown in FIG. 17. The core functions 1701 of the '186 processor remain unchanged while the DRAM control unit 1703 and the bus interface unit 1705 are modified to provide the RAS and CAS signals 1707 and the multiplexed address signals 1709 along with the data signals 1711. A block diagram showing further details of both the '186 core and the DRAM control 1703 of processor 101 is shown in FIG. 18. The DRAM control unit will select the appropriate multiplexed RAS and CAS signals according to the values contained in control registers 1803 such as the upper and lower memory chip select registers shown in FIGS. 3 and 4 and provide the appropriate signals to the DRAM in accordance with the timing diagrams illustrating the appropriate timing for the RAS and CAS signals. The DRAM/Refresh control unit 1801 shown as part of the bus interface unit 1805, will provide the appropriate refresh signals according to the control registers described in FIGS. 16a and 16b. Note that the bus interface unit 1805 contains output circuits such as those shown in FIG. 13, to multiplex address bits appropriately for the DRAM address.

The description of the invention set forth herein is illustrative, and is not intended to limit the scope of the invention as set forth in the following claims. For instance, while the invention has been generally described in terms of a '186 implementation, the invention may be applicable to other processors which want to provide a fully integrated DRAM controller according to the present invention. Variations and modifications of the embodiments disclosed herein, may be made based on the description set forth herein, without departing from the scope and spirit of the invention as set forth in the following claims.

What is claimed is:

1. A processor comprising:

a first circuit, responsive to a first value of a first programmable DRAM mode control signal and a first address range, to generate on a first output terminal of the processor a first row address strobe (RAS) signal for a DRAM mapped into the first address range, wherein the first circuit is responsive to a second value of the first programmable DRAM mode control signal and the first address range to generate a first non-DRAM control signal on the first output terminal;

a second circuit responsive to a first value of a second programmable DRAM mode control signal and a second address range, to generate on a second output terminal of the processor a second row address strobe (RAS) signal for a DRAM mapped into the second address range, wherein the second circuit is responsive to a second value of the second programmable DRAM mode control signal and the second address range to generate a second non-DRAM control signal on the second output terminal; and a third circuit responsive to the first address range and the first value of the first DRAM mode control signal to generate on a third output terminal of the processor a column address strobe (CAS) signal for the DRAM mapped into the first address space, the third circuit also being responsive to the second address range and the first value of the second DRAM mode control signal to generate on the third output terminal of the processor the column address strobe (CAS) signal for the DRAM mapped into the second address space.

2. The processor as recited in claim 1 wherein the fist and second non-DRAM control signals are first and second chip select signals.

3. The processor as recited in claim 1 wherein the third circuit is responsive to a second value of the first and second programmable DRAM mode control signals and a third address range to generate a third non-DRAM control signal on the third output terminal.

4. The processor as recited in claim 3 wherein the third non-DRAM control signal is a third chip select signal.

5. The processor as recited in claim 1 wherein the first and second address ranges are non overlapping.

6. The processor as recited in claim 1 wherein the first and second address ranges are programmable block having a size selected from one of 64K, 128K, 256K and 512K.

7. The processor as recited in claim 1 wherein the first and second programmable DRAM mode control signals are determined according to a programmable register.

8. The processor as recited in claim 1 wherein one of the non-DRAM control signals is one of a (data transmit or receive) signal and a data enable signal.

9. A computer system comprising:

a microcontroller having means for selectively generating first and second row address strobes and at least one column address strobe, the column address strobe being asserted for both the first and second row address strobes; and a DRAM coupled to the microcontroller to receive one of the first and second row address strobes and the column address strobe.

10. The computer system as recited in claim 9 wherein the microcontroller is a '186 compatible microcontroller.

11. A method of operating a processor to access a DRAM comprising:

selectably generating on a first output terminal of the processor one a first row address strobe signal and a first chip select signal according to a first DRAM mode signal when an address is in a first address range;

selectably generating one of a second row access strobe signal and a second chip select signal on a second output terminal of the processor according to a second DRAM mode, when the address is in a second address range; and selectably generating on a third output terminal of the processor one of a first column address strobe signal and a third chip select signal according to the first DRAM mode when the address is in the first address range and according to the second DRAM mode when the address is in the second address range.

12. The method as recited in claim 11 further comprising:

selectably providing one of an upper column address strobe and a fourth chip select signal on a fourth output terminal of the processor according to the first DRAM mode or second DRAM mode, the upper column address strobe indicating access to a high byte, and wherein the first column address strobe signal is a lower column address strobe signal indicating access to a low byte.

13. The method as recited in claim 11 wherein the first and second address ranges are programmable blocks of address ranges.

14. The method as recited in claim 11 wherein the second chip select signal is asserted when the address is within an upper portion of available address space.

* * * * *